(12) United States Patent
Lin et al.

(10) Patent No.: US 9,054,303 B2
(45) Date of Patent: Jun. 9, 2015

(54) METAL-OXIDE-SEMICONDUCTOR (MOS) TRANSISTOR STRUCTURE INTEGRATED WITH A RESISTANCE RANDOM ACCESS MEMORY (RRAM) AND THE MANUFACTURING METHODS THEREOF

(71) Applicant: Fudan University, Shanghai (CN)

(72) Inventors: Xi Lin, Shanghai (CN); Pengfei Wang, Shanghai (CN); Qingqing Sun, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/663,077

(22) Filed: Oct. 29, 2012

(65) Prior Publication Data
US 2013/0341696 A1    Dec. 26, 2013

(30) Foreign Application Priority Data

Jun. 21, 2012  (CN) .......................... 2012 1 0206312
Jun. 21, 2012  (CN) .......................... 2012 1 0206510

(51) Int. Cl.
*H01L 45/00* (2006.01)
*H01L 27/24* (2006.01)
*G11C 13/00* (2006.01)

(52) U.S. Cl.
CPC ............ *H01L 45/1206* (2013.01); *H01L 45/16* (2013.01); *H01L 45/1226* (2013.01); *G11C 13/0002* (2013.01); *H01L 45/04* (2013.01); *H01L 45/1233* (2013.01); *H01L 45/146* (2013.01); *H01L 45/1616* (2013.01); *H01L 27/2436* (2013.01)

(58) Field of Classification Search
CPC .......... H01L 45/122–45/1246; G11C 13/0002
USPC ............. 257/314, 414, 257, 225, 184, 80, 21, 257/53, 431–466, 1–5, 379; 365/148
See application file for complete search history.

(56) References Cited

U.S. PATENT DOCUMENTS

2011/0026297 A1*  2/2011  Lin et al. ........................ 365/148
2012/0020138 A1*  1/2012  Lue et al. ......................... 365/63

* cited by examiner

*Primary Examiner* — Matthew Landau
*Assistant Examiner* — Eric Ashbahian
(74) *Attorney, Agent, or Firm* — Jenkins, Wilson, Taylor & Hunt, P.A.

(57) ABSTRACT

The present invention belongs to the technical field of semiconductor memories, in particular to a metal oxide semiconductor (MOS) transistor structure integrated with a resistance random access memory (RRAM). The MOS transistor structure comprises a MOS transistor and a RRAM formed on a substrate, wherein a gate dielectric layer of said MOS transistor extends to the surface of a drain region of said MOS transistor; and the part of the gate dielectric layer on the surface of the drain region of said MOS transistor faults a resistance-variable storage layer of said RRAM. In this invention, the high-quality dielectric layer of the MOS transistor and the resistance-variable storage layer of the RRAM are obtained by primary atomic layer deposition which integrates the RRAM and MOS transistor together without increasing steps. This process is simple and can combine the shallow trench isolation or field oxygen isolation and ion implantation or diffusion of source electrode and drain electrode to make integration convenient.

3 Claims, 8 Drawing Sheets

METAL-OXIDE-SEMICONDUCTOR (MOS) TRANSISTOR STRUCTURE INTEGRATED WITH A RESISTANCE RANDOM ACCESS MEMORY (RRAM) AND THE MANUFACTURING METHODS THEREOF

CROSS-REFERENCE TO RELATED APPLICATION

This application claims priority to Chinese Patent Application No. CN 201210206312.9 and CN 201210206510.5 both filed on Jun. 21, 2012, the entire content of which is incorporated by reference herein.

BACKGROUND OF THE INVENTION

1. Technical Field

The present invention relates to a field effect transistor structure, in particular to a field effect transistor structure integrated with a RRAM and a manufacturing method thereof, belonging to the technical field of semiconductor memories.

2. Description of Related Art

Information reading and writing of the RRAM is realized by reading or changing the resistance of the resistance-variable material. By the action of an external voltage, the resistance of the RRAM has a high state and a low state, which are represented by "0" and "1". With different voltages, the resistance of the RRAM can be switched between the high state and the low state to realize information storage. The RRAM has advantages of simple preparation, high storage density, low operation voltage, quick speed of reading and writing, long service time, nondestructive access, low power, and in comparison with CMOS (complementary metal-oxide-semiconductor) high process compatibility, and therefore is regarded as one of the most powerful candidates of the next generation of "universal" memories.

At present, MOS transistor structures (metal-oxide-semiconductors, namely field effect transistors) are usually adopted as the driving device of the RRAM, and the RRAM is usually formed in the subsequent interconnection procedure of the MOS transistor. The integration structure of the RRAM and the MOS transistor in the prior art can be seen in FIG. 1, comprising a MOS transistor structure, a metal interconnection structure and a RRAM structure formed on a semiconductor substrate 100, wherein the MOS transistor structure comprises a source region 101, a drain region 102, a gate dielectric layer 103, a gate electrode 104, and an insulating layer 105 which isolates the gate region from other conductive layers of this unit; the metal interconnection structure comprises an interlayer isolating layer 106 in a primary layer interconnection, a diffusion blocking layer 107 and a copper interconnection line 108 in a contact hole, an etching blocking layer 109 and an interlayer isolating layer 110 in a second layer interconnection, and a diffusion blocking layer 111 and a copper interconnection line 112 in a contact hole of the second layer interconnection; the resistance random access structure comprises a resistance-variable material layer 113 and a conductive material layer 114, and the insulating layer 115 isolates the RRAM from other conductor layers of this unit.

As mentioned above, the integration structure of said resistance random accessory memory and said MOS transistor structure is complicated, is unfavorable for the integration of this unit and the development of this unit in the miniaturization direction.

BRIEF SUMMARY OF THE INVENTION

The objective of the invention is to provide an integration structure of a RRAM and a MOS transistor to simplify the process of integrating the RRAM and the MOS transistor.

To fulfill the above objective, the invention provides a MOS transistor structure integrated with a RRAM, comprising, A semiconductor substrate;

A MOS transistor and a RRAM formed on said substrate,

Wherein a gate dielectric layer of said MOS transistor extends to the surface of a drain region of said MOS transistor;

And the part of the gate dielectric layer on the surface of the drain region of the field effect transistor forms a resistance-variable storage layer of said RRAM.

In said MOS transistor structure integrated with the RRAM, said semiconductor substrate is silicon or silicon on an insulator. The gate dielectric layer of said field effect transistor is made of a resistance-variable material with a high dielectric constant.

Meanwhile, the present invention also provides two methods for manufacturing the above-mentioned MOS transistor structure integrated with the RRAM.

The first method for manufacturing the MOS transistor structure integrated with the RRAM comprises: forming a primary insulating film on the surface of the semiconductor substrate of the primary doping type; depositing a photoresist layer on said primary insulating film, and performing masking, exposure, and development to define positions of the source region and drain region of the MOS transistor; etching said primary insulating film at the positions of the source region and drain region of said MOS transistor to expose the semiconductor substrate; forming a source region and a drain region of a second doping type in said semiconductor substrate by ion injection or ion diffusion; stripping the photoresist; etching to remove the rest of the primary insulating film; growing a second insulating film on the surface of the semiconductor substrate by atomic layer deposition; depositing a primary conductive film on said second insulating film; depositing a photoresist on the surface of said primary conductive film and photo-etching to form patterns; and protecting the gate region of the MOS transistor with the photoresist; etching to remove the exposed primary conductive film and forming the gate electrode of the MOS transistor with the rest of the primary conductive film; stripping the photoresist; etching to remove the primary insulating film above said source region and reserve the second insulating film above said drain region, wherein the second insulating film above said drain region forms the resistance-variable storage layer of the RRAM.

According to the above-mentioned method, said primary insulating film is made from silicon oxide. Said second insulating film is made from a resistance-variable material with a high dielectric constant. Said primary conductive film is made from n-type or p-type doped polycrystalline silicon. Said primary doping type is n-type, while said second doping type is p-type; or said primary doping type is p-type, and said second doping type is n-type.

The second method for manufacturing the MOS transistor structure integrated with a RRAM comprises: forming a primary insulating film on the surface of a semiconductor substrate of a primary doping type; depositing a photoresist layer on said second insulating film, and performing masking, exposure, and development to define the position of the gate region; etching to remove said primary conductive film (which is not protected by the photoresist) and forming the gate electrode of the field effect transistor with the rest of the primary conductive film; stripping the photoresist; forming a source region and a drain region of a second doping type on both sides of said gate electrode in said semiconductor substrate respectively; etching to remove said primary insulating film above said source region and reserving said primary insulating film above said drain region, wherein said primary insulating film reserved above said drain region forms a resistance-variable storage layer of the RRAM.

According to the above-mentioned method, said primary insulating film is made from a resistance-variable material with a high dielectric constant. Said primary insulating film is made from silicon oxide. Said primary doping type is n-type, while said second doping type is p-type; or said primary doping type is p-type, and said second doping type is n-type.

In this invention, the high-quality gate dielectric layer of the MOS transistor and the resistance-variable storage layer of the RRAM are obtained by primary atomic layer deposition which integrates the RRAM and MOS transistor together without increasing steps. This process is simple and can combine the shallow trench isolation or field oxygen isolation and ion implantation or diffusion of source electrode and drain electrode to make integration convenient.

DETAILED DESCRIPTION OF THE INVENTION

The invention is further described in detail with the reference of the attached drawings and the embodiments. In the figures, to facilitate description, the layer thickness and region thickness are amplified, but the sizes do not represent the actual dimensions. The figures fail to reflect the actual dimensions of the device accurately, but show the mutual positions of the regions and the structures completely, especially the vertical and horizontal neighboring relationship of the structures.

Figure 1:
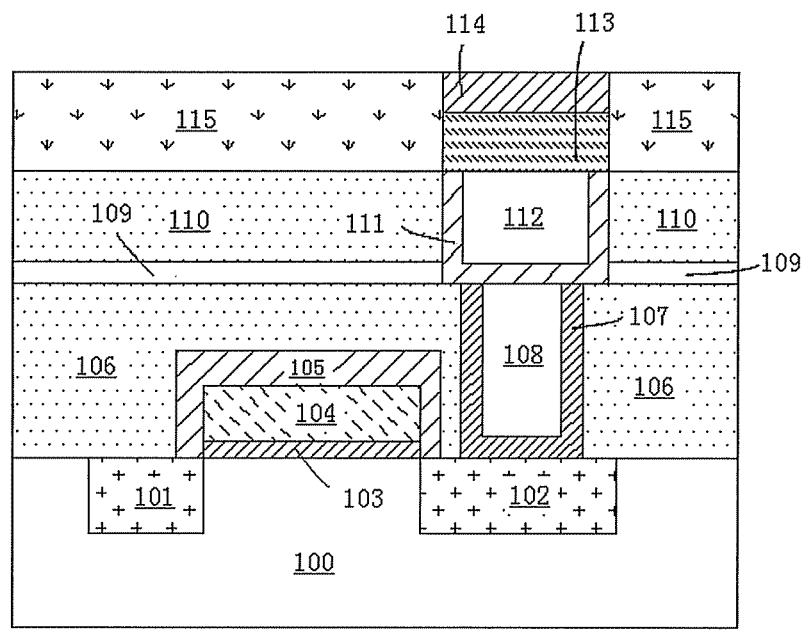
FIG. 1 is a sectional view of a MOS transistor structure integrated with a RRAM in prior art.
Figure 2:
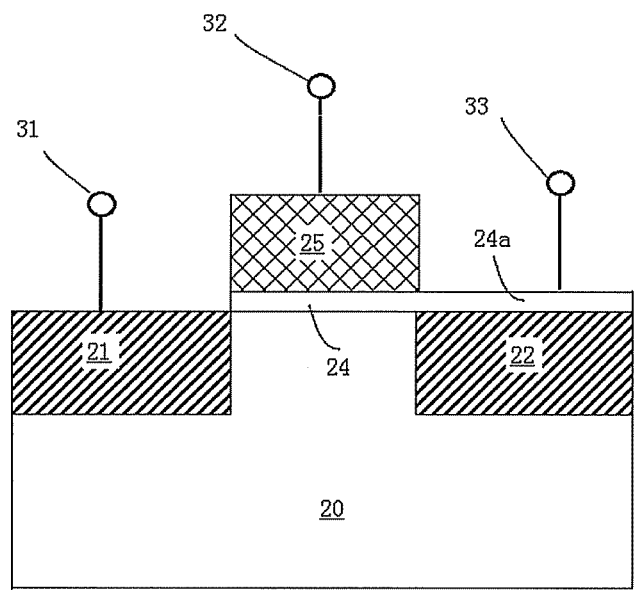
FIG. 2 is a sectional view of a MOS transistor structure integrated with a RRAM in one embodiment of the present invention.

FIG. 2 illustrates a MOS transistor structure integrated with a RRAM in one embodiment of the present invention, which is a sectional view along the trench length direction of this unit. As shown in FIG. 2, this unit is usually formed in a semiconductor substrate or a doped pit 20. Said semiconductor substrate or doped pit 20 is usually doped with n-type or p-type impurities at a low concentration. The doping type of the source region 21 and drain region 22 is opposite to that of the pit 20. The source region 21 as the source electrode of the MOS transistor can be connected with an external electrode 31 directly or via a contact, and the gate electrode 25 of the MOS transistor can be connected with an external electrode 32 directly or via a contact. The gate dielectric layer 24 of the MOS transistor exceeds the gate electrode and extends above the drain region 22, wherein the part 24a of the gate dielectric layer extending to be above the drain region 22 forms the resistance-variable storage layer of the RRAM, and the resistance-variable storage layer 24a is connected with an external electrode 33 directly or via a contact.

Figure 13:
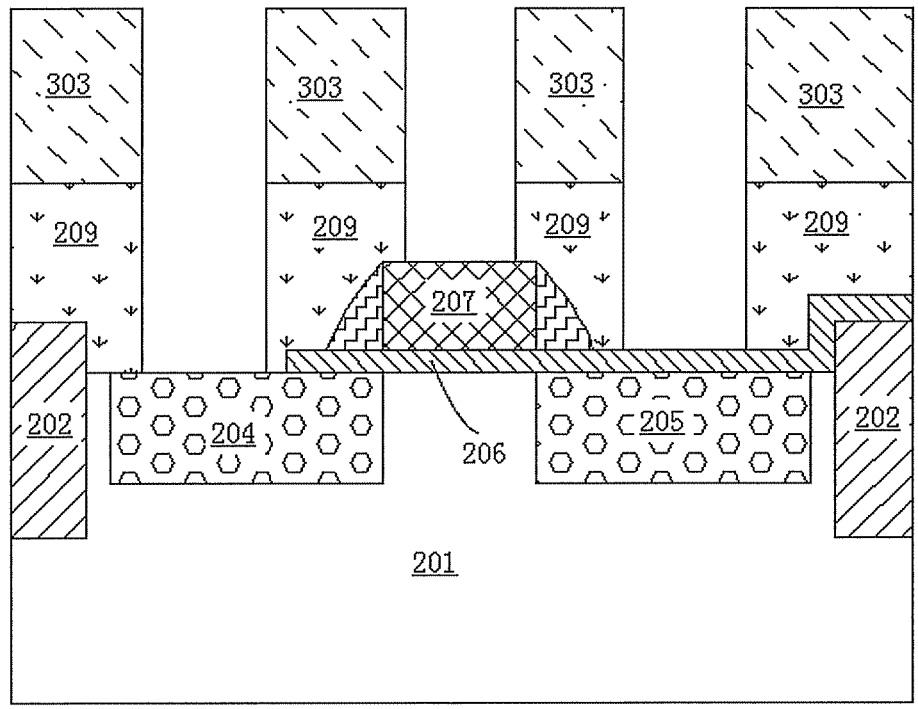
FIGS. 13-15 illustrate a part of the procedures in an integrated circuit composed of an n-type MOS transistor structure integrated with a RRAM.
Figure 14:
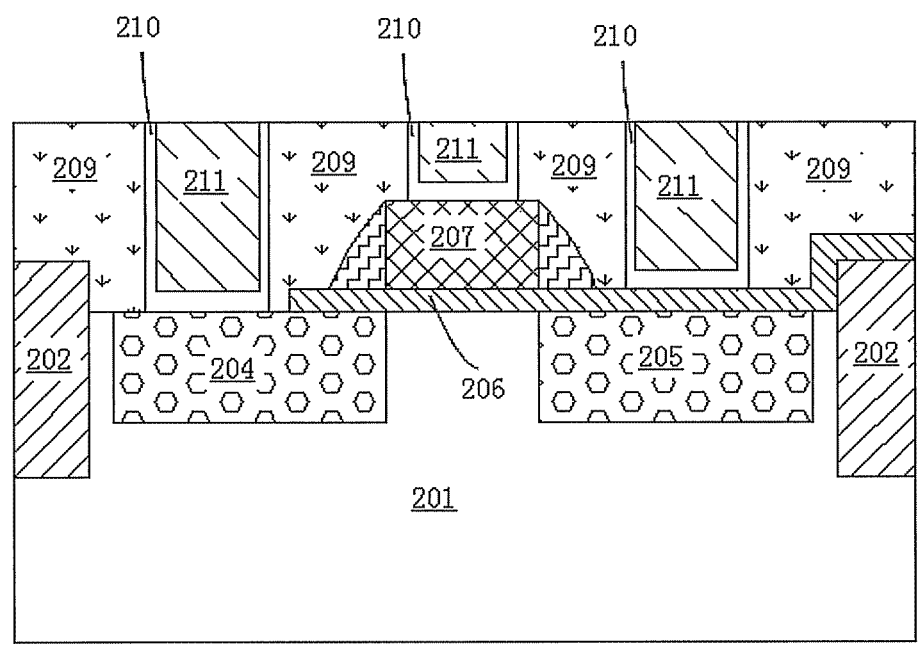
Figure 15:
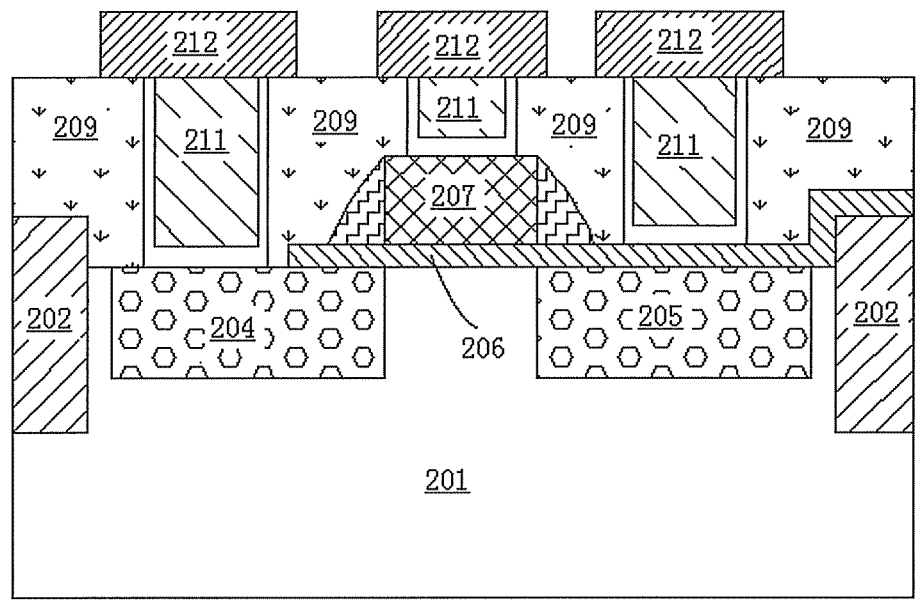

The MOS transistor structure integrated with the RRAM disclosed in the present invention can be manufactured by many methods. The following are two embodiments of methods for manufacturing an n-type MOS transistor structure integrated with a RRAM as shown in FIG. 2 of the present invention. FIGS. 3-7 illustrate a workflow chart of a method for manufacturing a MOS transistor structure integrated with a RRAM in embodiment 1 of the present invention. FIGS. 8-12 illustrate a workflow chart of a method for manufacturing a MOS transistor structure integrated with a RRAM in embodiment 2 of the present invention. FIGS. 13-15 depict a part of procedures in an integrated circuit composed of the n-type MOS transistor structure integrated with a RRAM.

To manufacture a p-type MOS transistor structure integrated with a RRAM, the n-type doping is interchanged by p-type doping in the description below.

A silicon substrate is taken as an example.

Embodiment 1

Figure 3:
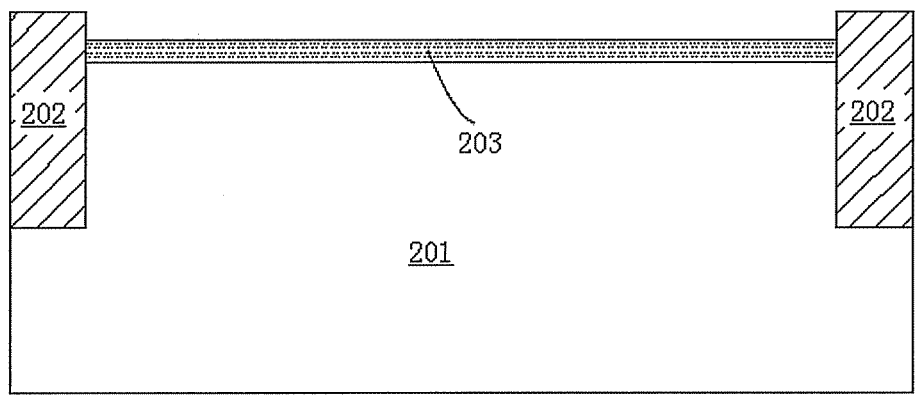
FIGS. 3-7 illustrate a workflow chart of a method for manufacturing a MOS transistor structure integrated with a RRAM in embodiment 1 of the present invention.

As shown in FIG. 3, first, form a shallow trench isolation (STI) structure or a field oxygen isolation structure in a light p-type ion-doped silicon substrate 201. This procedure is well-known in the field, illustrated by the STI structure 202 in the embodiment of the present invention. Second, grow a silicon oxide film 203 on the surface of the silicon substrate.

Figure 4:
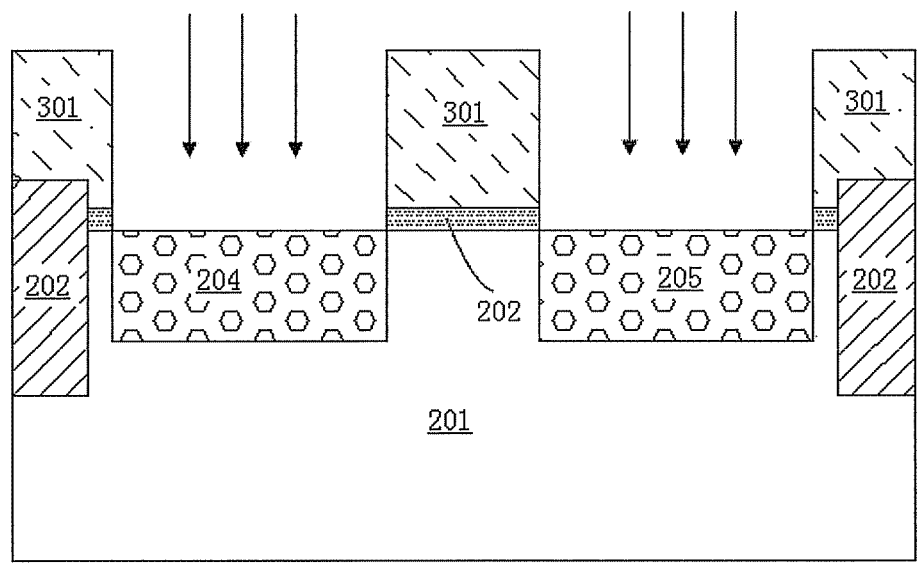

Third, deposit a photoresist layer 301 on the silicon oxide film 203, and perform masking, exposure, and development to define the positions of the source region and drain region of the MOS transistor; etch to remove the exposed silicon oxide film 203 and expose the surface of the silicon substrate 201; and form the n-type source region 204 and the n-type drain region 205 of this unit in the silicon substrate 201 by ion injection, as shown in FIG. 4.

Figure 5:
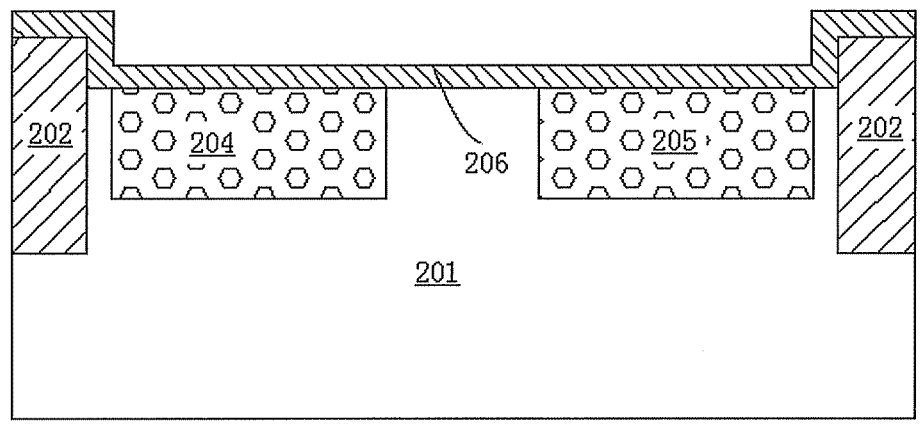

Fourth, strip the photoresist 301, etch to remove the rest of the silicon oxide film 203, and place the sample into an atomic layer deposition device to grow an HfO$_2$ gate dielectric layer 206 on the substrate surface by atomic layer deposition, as shown in FIG. 5.

Figure 6:
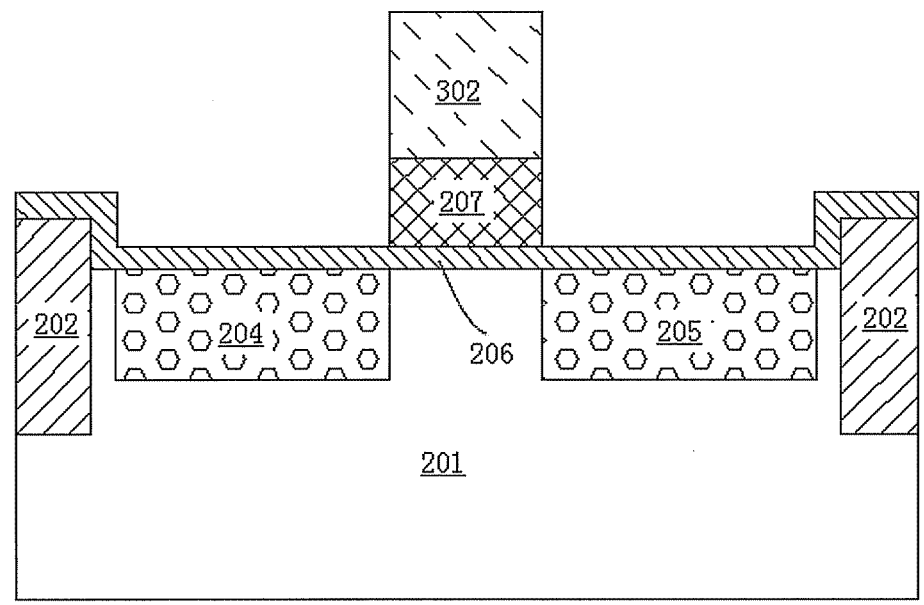

Fifth, deposit an n-type or p-type doped polycrystalline silicon layer on the gate dielectric layer 206, deposit a photoresist layer 302 on the polycrystalline silicon film, and perform masking, exposure, and development to form patterns; protect the gate region of the MOS transistor with the photoresist, and then etch to remove the exposed polycrystalline silicon film, wherein the rest of the polycrystalline silicon film foams the gate electrode 207 of the MOS transistor and the gate electrode 207 is located on the substrate between the source region 204 and the drain region 205, as shown in FIG. 6.

Figure 7:
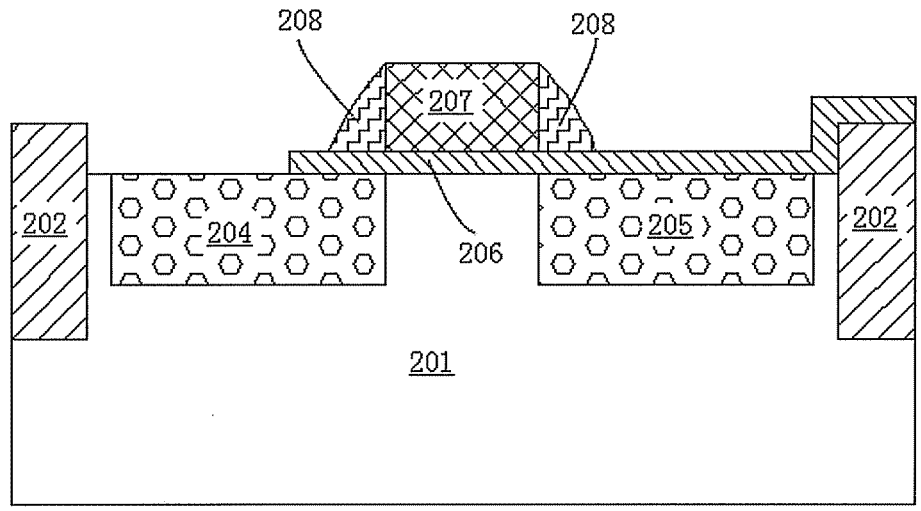

Sixth, strip the photoresist 302, cover the gate electrode 207 with an insulating film such as silicon nitride; deposit a photoresist layer; perform masking, exposure, and development to form patterns; etch to remove the exposed silicon nitride film, wherein the rest of the silicon nitride film forms the grid flank wall 208 of the MOS transistor. And seventh, strip the photoresist; deposit a new photoresist layer on the above structure; mask, expose and develop to define the position of the source region 204; and etch to remove the part of the gate dielectric layer part above the source region 204, wherein the part of the gate dielectric layer above the drain region 205 is reserved as the resistance-variable storage layer of the RRAM; stripping the photoresist to obtain a structure as shown in FIG. 7.

Embodiment 2

Figure 8:
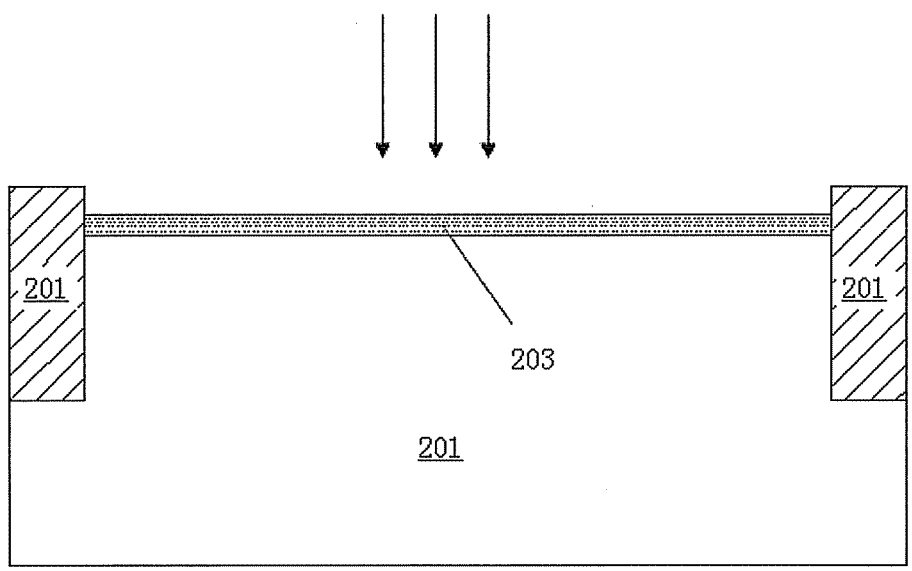
FIGS. 8-12 illustrate a workflow chart of a method for manufacturing a MOS transistor structure integrated with a RRAM in embodiment 2 of the present invention.

As shown in FIG. 8, first, form a shallow trench isolation (STI) structure or a field oxygen isolation structure in a light p-type ion-doped silicon substrate 201. This process is well-known in the field, illustrated by the STI structure 202 in the embodiment of the present invention. Second, grow a silicon oxide film 203 on the surface of the silicon substrate 201, and then perform trench injection to the silicon substrate 201, wherein this is process is well-known in this field.

Figure 9:
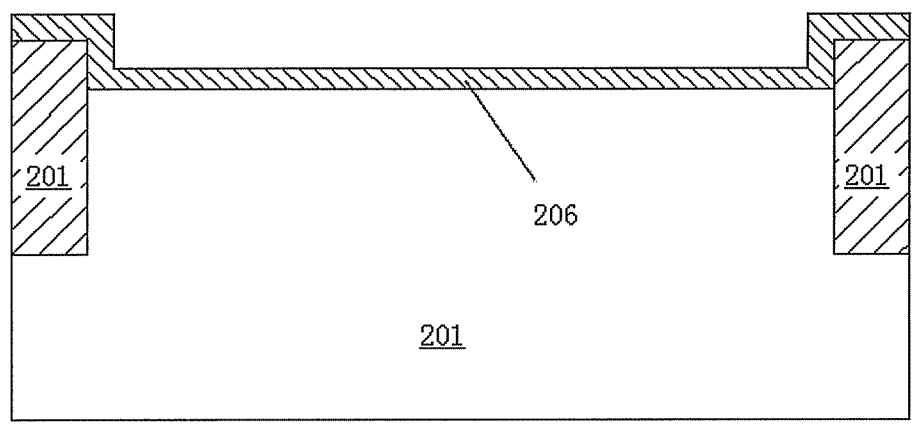

Third, strip the silicon oxide film 203, and place the sample into an atomic layer deposition device to grow an HfO$_2$ gate dielectric layer 206 on the surface of the silicon substrate 201 by atomic layer deposition, as shown in FIG. 9.

Figure 10:
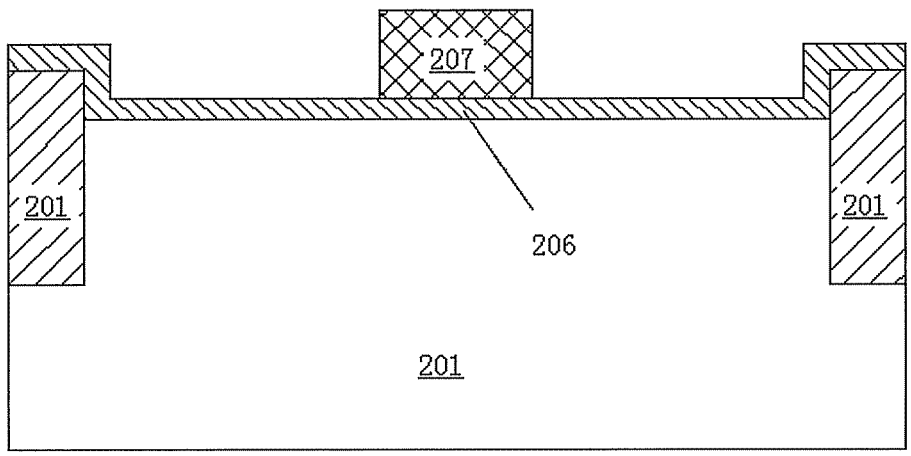

Fourth, deposit a polycrystalline silicon film on the gate dielectric layer 206 and a photoresist layer on the polycrystalline silicon film; perform masking, exposure, and development to form patterns; protect the gate region of this unit with the photoresist; etch to remove the polycrystalline silicon film without the protection of the photoresist, rest of the polycrystalline silicon film fowls the gate electrode 207 of this unit; and strip the photoresist to obtain a structure as shown in FIG. 10.

Figure 11:
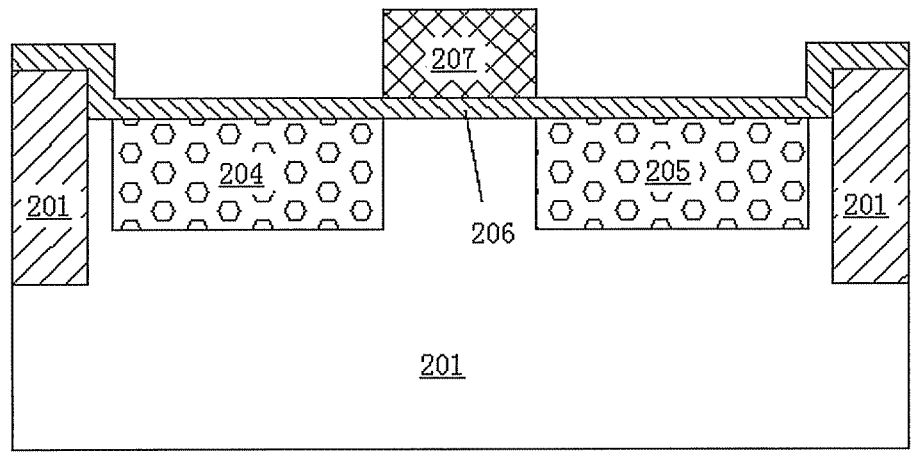

Fifth, form the n-type source region 204 and the n-type drain region 205 of the MOS transistor respectively on both sides of the gate electrode 207 in the silicon substrate 201 by ion injection or ion diffusion, as shown in FIG. 11. In this procedure, the source region 204 and the drain region 205 of the MOS transistor are formed in a self-aligned manner.

Figure 12:
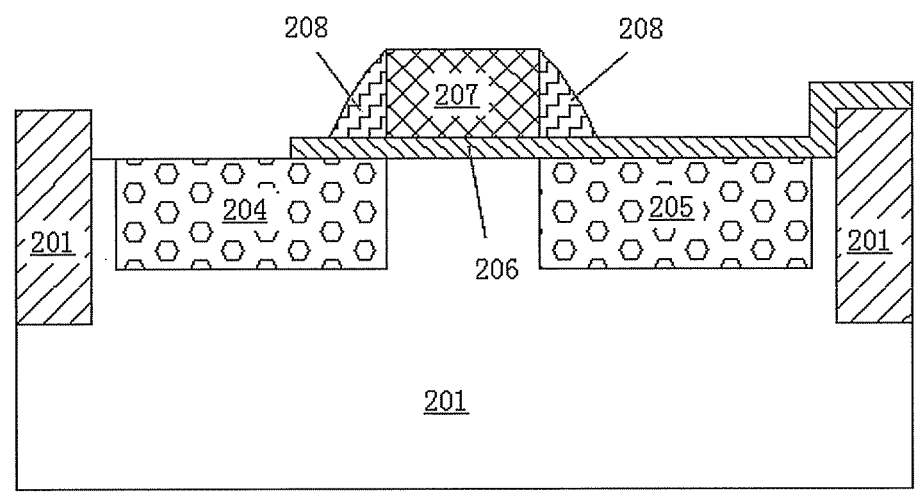

And sixth, cover the gate electrode 207; deposit an insulating film such as silicon nitride; deposit a photoresist layer on the silicon nitride film; perform masking, exposure, and development to faun patterns; etch to remove the silicon nitride film without protection of the photoresist, wherein the rest of the silicon nitride film forms the grid flank wall 208 of this unit; strip the photoresist; deposit a photoresist layer on the above structure and perform masking, exposure, and development to define the position of the source region 204; etch the part of the gate dielectric layer 206 above the source region 204 to expose the source region 204, wherein the part of the gate dielectric layer 206 above the drain region 205 is reserved as the resistance-variable storage layer of the RRAM; strip the photoresist to obtain the structure as shown in FIG. 12.

After the MOS transistor structures integrated with the RRAM as shown in FIG. 7 and FIG. 12 are formed, an interconnection metal layer can be further formed on the structures as shown in FIGS. 7 and 12.

First, cover the structures as shown in FIG. 7 and FIG. 12; deposit an insulating film 209 as a passivation layer 209 (boron-phosphorosilicate glass for example) of this unit; deposit a photoresist layer 303 on the passivation layer; perform masking, exposure, and development to define the position of a contact hole; etch to remove the exposed passivation layer 209 so as to form the contact hole, as shown in FIG. 13.

Second, strip the photoresist 303 and then form a metal plug in the contact hole; a tungsten plug for example. To strengthen the adhesion force of the tungsten, usually an adhesive layer 210, such as TiN, is deposited in the contact hole first and then followed by the metal tungsten 211, and this unit after chemical and mechanical polishing can be seen in FIG. 14.

And third, deposit a metal layer 212 such as aluminum on the above structure; deposit a photoresist layer on the metal layer 212; perform masking, exposure, and development to form patterns; etch to remove the exposed metal layer, form the source electrode, gate electrode and drain electrode with the rest of the metal layer; and strip the photoresist to obtain a structure as shown in FIG. 15.

As mentioned above, a plurality of embodiments with great differences may be constructed. It should be noted that, except those defined in the attached claims, the present invention is not limited to the embodiments in the description.

The invention claimed is:

1. A field effect transistor structure integrated with a resistance random access memory (RRAM), comprising:
a semiconductor substrate; and
a field effect transistor, wherein the field effect transistor and a RRAM are formed on the semiconductor substrate;
a gate dielectric layer of the field effect transistor extending over, approximately, an entire top surface of a drain region of the field effect transistor; and
the part of the gate dielectric layer on the entire top surface of the drain region of the field effect transistor forming a resistance-variable storage layer of said RRAM.

2. The field effect transistor structure integrated with a RRAM according to claim 1, wherein the semiconductor substrate is silicon or silicon on an insulator.

3. The field effect transistor structure integrated with a RRAM according to claim 1, wherein the gate dielectric layer of the field effect transistor is made of a resistance-variable material with a high dielectric constant.

* * * * *